United States Patent [19]
Murakami

[11] Patent Number: 5,350,946
[45] Date of Patent: Sep. 27, 1994

[54] SEMICONDUCTOR DEVICE WITH CORRECT CASE PLACEMENT FEATURE

[75] Inventor: Yukio Murakami, Kawasaki, Japan

[73] Assignee: Fuji Electric Co., Ltd., Kawasaki, Japan

[21] Appl. No.: 75,748

[22] Filed: Jun. 11, 1993

[30] Foreign Application Priority Data

Jun. 29, 1992 [JP] Japan .................. 4-169730

[51] Int. Cl.$^5$ .............. H01L 23/48; H01L 29/46; H01L 29/62; H01L 29/64
[52] U.S. Cl. .................. 257/693; 257/724
[58] Field of Search ............ 257/723, 724, 728, 688, 257/693, 695, 698, 689

[56] References Cited

U.S. PATENT DOCUMENTS

| 4,815,042 | 4/1989 | Kaufman | 257/693 |
| 4,920,405 | 4/1990 | Itoh et al. | 257/724 |

FOREIGN PATENT DOCUMENTS

| 0292848 | 5/1988 | European Pat. Off. . |
| 0455322 | 2/1991 | European Pat. Off. . |
| 2819327 | 5/1978 | Fed. Rep. of Germany . |
| 2395603 | 6/1978 | France . |
| 59-84459 | 5/1984 | Japan .................. 257/724 |

*Primary Examiner*—Rolf Hille
*Assistant Examiner*—S. V. Clark
*Attorney, Agent, or Firm*—Brumbaugh, Graves, Donohue & Raymond

[57] ABSTRACT

A semiconductor device construction wherein externally drawn terminals are arranged to be easily connected externally, so that it can be applied to a module containing any of various chip sets. Terminals connected to the main electrodes of each semiconductor chip contained in an enclosing case are arranged side by side and drawn out through slots formed in the top of the case and grouped according to their polarities. Terminals with the same polarity are arranged in straight rows, while the terminal rows are arranged in parallel between groups of terminals with different polarities.

5 Claims, 3 Drawing Sheets

SEMICONDUCTOR DEVICE WITH CORRECT CASE PLACEMENT FEATURE

BACKGROUND OF THE INVENTION

The present invention relates to a resin-sealed semiconductor device that incorporates diode modules, thyristor modules, or power transistor modules.

A resin-sealed semiconductor of conventional construction shown in FIGS. 7 and 8 as incorporating a two-set diode module by way of example, two diodes chips D1 and D2 are assembled into a module, and externally drawn terminals 1A, 1K, 2A and 2K are respectively connected to an anode electrode and a cathode electrode of the diode chips and are drawn out therefrom. The diode chips D1 and D2 are solder-mounted on a chip base 5 (a copper plate larger than the diode chip) laminated on a heat-dissipating metal base 3 via an insulation substrate 4, the metal base 3 being disposed within an enclosing case 6 which surrounds the parts. The externally drawn terminals 1K and 2K on the cathode electrodes are formed by being drawn upward and being coupled with the chip base 5, the externally drawn terminals 1A and 2A on the anode electrodes are solder-bonded with the main upper face of the diode chips D1 and D2 via ]-shaped connecting pieces 7, and each externally drawn terminal is drawn to the top surface of the case by passing through an upper lid on the case 6, and are laid in one row in the order 1A, 1K, 2K and 2A from left to right.

The case 6 is filled with a molding resin (epoxy resin for example) to seal the parts, including the diode chips assembled in the modules. The molding resin is injected into the case through a resin-injection hole at the center of the top of the case after the case 6 has been bonded to the metal base 3.

The described conventional module construction has the following handling and assembly drawbacks:

(1) If two-set diodes D1 and D2 assembled in a module are to be connected in parallel, for example, since the externally drawn terminals 1A, 1K, 2K and 2A of each diode chip are arranged along a common line of the case, two types of external connecting pieces 9A and 9K having the complex shape shown in FIG. 9 are required to interconnect the diodes, which results in increasing manufacturing costs.

(2) Because the externally drawn terminals 1A, 1K, 2K and 2A are laid along a common line left to right, all have the same conductor width, and the enclosing case 6 fitted onto these externally drawn terminals has a symmetrical shape, it is possible for the case 6 to accidentally be mounted in a reverse direction when the case 6 is being assembled on the metal base. Moreover, because the enclosing case 6 initially has diode terminal symbol markings on it, the actual externally drawn terminals will not match the terminal symbols if the case is accidentally mounted in a reverse direction.

(3) When filling the enclosing case with resin after the parts have been assembled, the externally drawn terminals laid in the case obstruct the free flow of injected resin. This is an inconvenience in that the amount of resin injected will be insufficient, and the resin-filling work will take more time.

(4) The connecting pieces 7, which are separate parts, are disposed on the anode electrode side of the diode chips, between the diode chips and the externally drawn terminals, in order to absorb stress caused as a result of the difference in the thermal expansion of the mold resin and the externally drawn terminals. This structure increases the number of parts as well as the number of man hours required for soldering, causing an increase in costs.

A primary object of the present invention is to provide a semiconductor device construction that will overcome the described problems of known constructions and which will offer advantages in terms of assembly, handling and manufacturing costs.

SUMMARY OF THE INVENTION

Briefly, in a semiconductor device according to the invention, semiconductor chips, for example diodes, are contained in an enclosing case. Externally drawn terminals connected to main electrodes of each semiconductor chip are arranged side by side and drawn out through slots formed in the top of the case and grouped according to their polarities. Terminals with the same polarity are arranged along straight rows, while the terminal rows are arranged in parallel between groups of terminals with different polarities. Thus, if in use the contained semiconductors are connected in parallel, the externally drawn terminals having the same polarity can be interconnected, without interference from the externally drawn terminals with different polarities, using simple strip-shaped conductor bars.

The riser conductors of the externally drawn terminals of one polarity have a different width than the riser conductors of the externally drawn terminals of different polarity and extend through respective slots formed in the top having sizes corresponding to the widths of the riser conductors. Accordingly, the enclosing case cannot be assembled onto the externally drawn terminals with its horizontal direction reversed because in the reverse position the widths of the terminals will not match the widths of the slots and thus preclude incorrect assembly of the case over the externally drawn terminals.

The wider riser conductors of the externally drawn terminals are linked to a base on which the semiconductor chips are mounted and have notches formed therein which function as paths for the flow of sealing resin injected into the enclosing case. The notches reduce the fluid resistance to the injected molding resin and allows it to flow smoothly around the contained parts, preventing possible defects which could result from incomplete resin filling. The resin is injected through two or more holes formed in the top of the enclosing case, which holes have different shapes and sizes so as to be visually identified. Thus, an assembly worker merely by observing the arrangement of the resin injecting holes, and recognizing in advance of starting the assembly work the relationship between the polarities and arrangement of the terminals and the arrangement of the resin-injecting holes, even if it involves assembly of the same parts into different devices, will be able to determine without error the polarity and arrangement of the terminals without having to refer to the terminal symbols usually marked on the side of the case which, in any case, are so small as to be difficult to see.

BRIEF DESCRIPTION OF THE DRAWINGS

Other objects, features and advantages of the invention will become apparent, and its construction better understood, from the following detailed description read in conjunction with the accompanying drawings, in which:

FIGS. 6(a) and 6(c) are cross-sections taken along line 6b—6b and line 6c—6c, respectively, in FIG. 6(a);

DETAILED DESCRIPTION OF THE PREFERRED EMBODIMENTS

Figure 1:
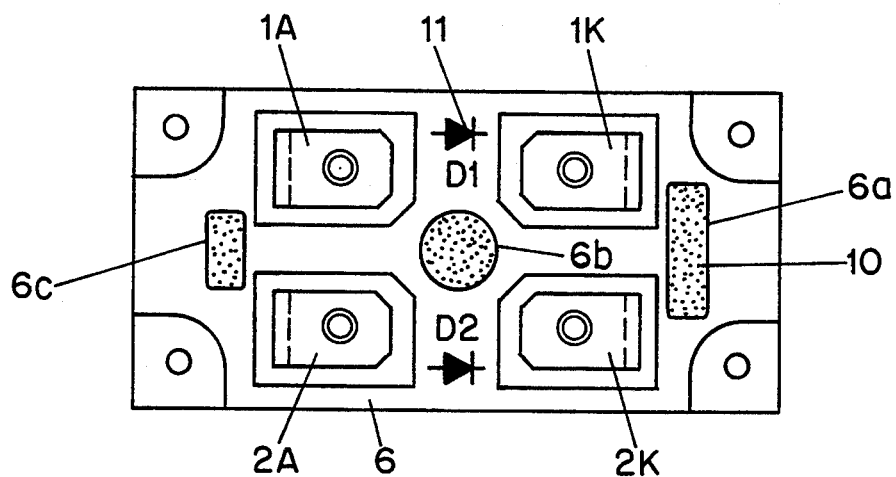
FIG. 1 is a plan view showing one embodiment of the present invention applied to a two-set diode module.
Figure 2:
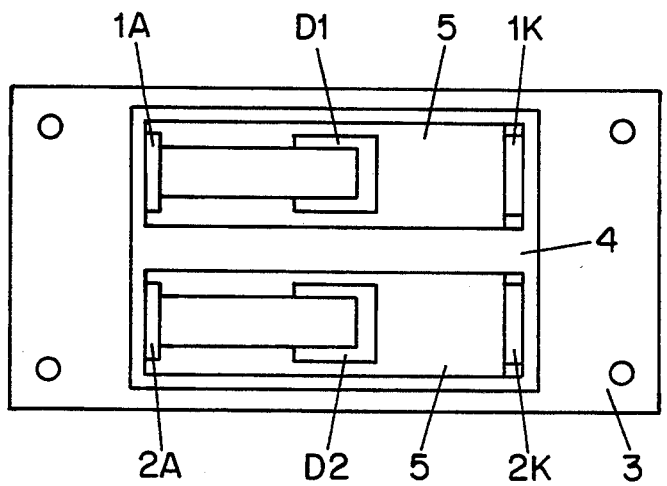
FIG. 2 is a plan view, with the enclosing case removed, showing the internal construction of the device shown in FIG. 1.
Figure 3:
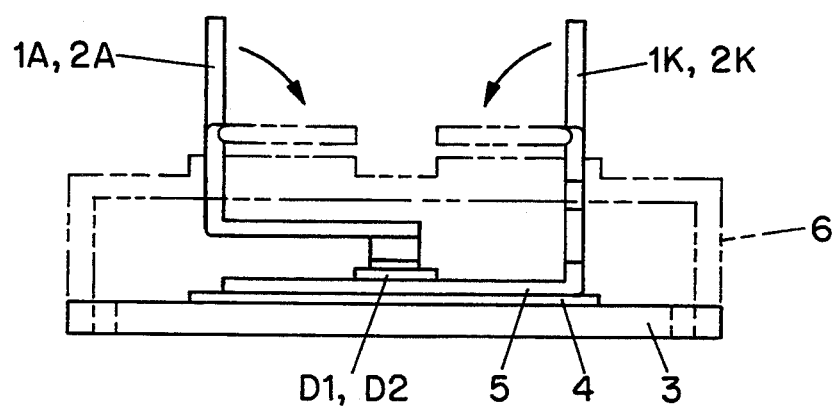
FIG. 3 is a side view of FIG. 2.
Figure 7:
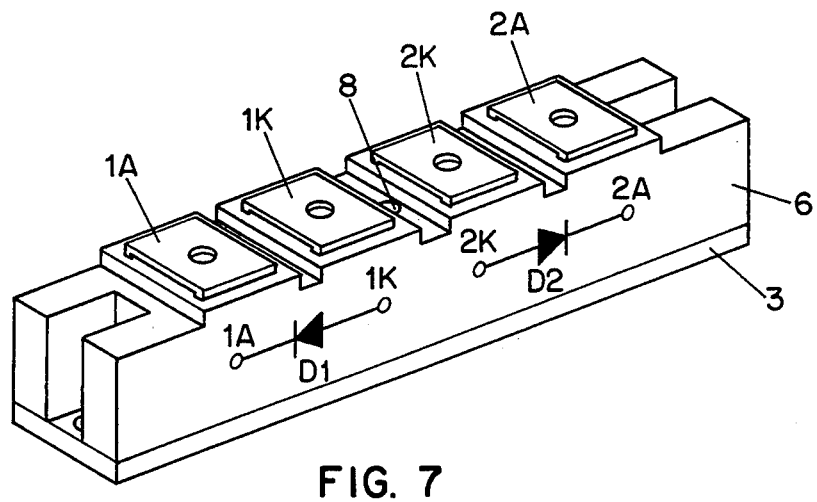
FIG. 7 to which previous reference has been made, is a perspective view showing the assembly configuration of a conventional two-set diode module.
Figure 8:
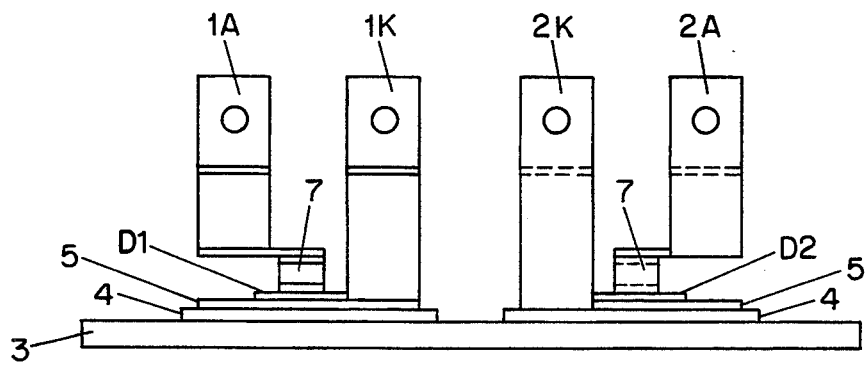
FIG. 8 is a side view which illustrates the internal construction of the device shown in FIG. 7.
Figure 9:
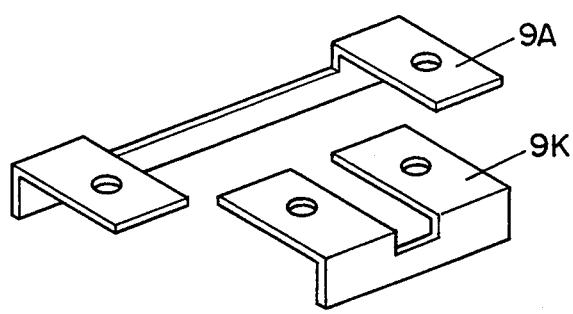
FIG. 9 is a perspective view showing the external connecting conductor pieces used to interconnect two sets of diodes in a parallel in the configuration shown in FIG. 7. Connecting conductor pieces used to interconnect two sets of diodes in parallel in the configuration shown in FIG. 7.

Referring to FIGS. 1–3, wherein parts identical to those present in the prior art device shown in FIGS. 7 and 8 are given the same reference numerals, diode chips D1 and D2 are mounted on chip bases 5 laid in two rows, wherein externally drawn terminals 1A and 2A on the anode electrodes are drawn out to the left of the chip base 5, and externally drawn terminals 1K and 2K on the cathode electrodes are drawn out to the right, respectively sandwiching the diode chips D1 and D2, said parts being disposed separately on top of an enclosing case 6. As can be seen in FIG. 1, the externally drawn terminals 1A and 2A on the anode electrodes and the externally drawn terminals 1K and 2K on the cathode electrodes, in which the terminals of a pair have the same polarity, are laid on straight lines, while the terminal row 1A and 1K and the terminal row 2A and 2K, in which the terminals have different polarities, are arranged in parallel. In such a structure, using two sets of diode chips D1 and D2 assembled in a module, and connecting them in parallel externally to the module, the externally drawn terminals 1A and 2A on the anode electrodes and the externally drawn terminals 1K and 2K on the cathode electrodes because they are laid on straight lines can be easily interconnected with a single kind of simple strip-shaped conductor bar without the need to use external connecting pieces with a complex shape such as used in the conventional structure, which is shown in FIG. 9.

Resin-injecting holes 6a, 6b and 6c are formed at three positions in the top of the case 6—on the right edge, at the center and on the left edge and have a predetermined relationship to the arrangement of the externally drawn terminals. In the illustrated example, the resin-injection hole 6a at the right edge close to the external drawn terminals 1K and 2K, is rectangular and has a relatively large area, the resin-injection hole at the center is round, and the hole 6c at the left edge close to the terminals 1A and 2A is rectangular in shape and has a relatively small area; that is, the holes all have a different shape and size. The molding resin 10 is injected simultaneously through resin-injection holes 6a, 6b and 6c into the enclosing case 6. The case 6 has marks 11 printed thereon which indicate the rectifying direction of the diode chip. By simultaneously injecting the molding resin through the three separated holes 6a, 6b and 6c,, the resin can be injected efficiently into every corner of the case 6 in a short time. Furthermore, when completed products are attached to different devices, the assembly work can be carried out efficiently by observing the arrangement direction of the terminal polarities according to the arrangement pattern of the resin-injecting holes 6a, 6b and 6c, which have different shapes and sizes, by initially recognizing the relationship between the arrangement of the resin-injecting holes and the terminal polarities, without the need to check one by one the terminal symbol marks printed on the cases (which are very small and difficult to see) during the assembly work.

Figure 4A:
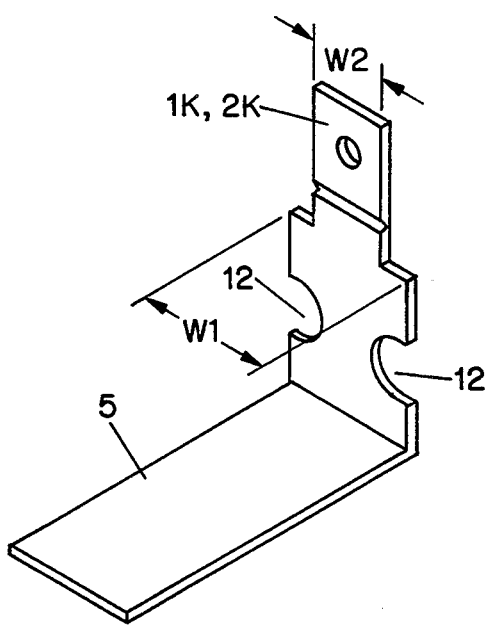
FIGS. 4(a) and 4(b) are perspective views showing the construction of two embodiments of the externally drawn terminals connected to the cathode electrodes in FIG. 1.
Figure 4B:
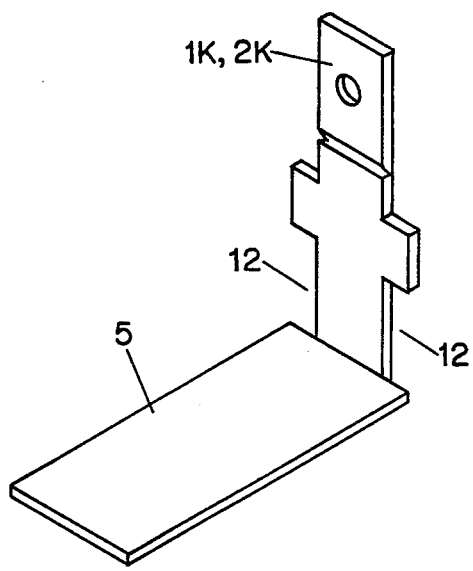

The externally drawn terminals 1K and 2K, two embodiments of which are shown in FIGS. 4(a) and 4(b), respectively, includes a rising portion having a width W1 which is integral with and extends upwardly from a chip base portion 5 of the same width as the rising portion on which the cathode electrode of a diode is assembled by soldering. Notches 12 formed on both sides of the rising portion, semicircular in shape in the FIG. 4(a) embodiment and rectangular in shape in the FIG. 4(b) embodiment, function to increase the area of the flow paths of the injected molding resin. At the same time, the resin that has entered the notches 12, when hardened, bonds more strongly to the terminals 1K and 2K than would be the case without the notches. The tip of the riser portion which extends through and above the case, also called the extended portion, has a width W2, which is less than width W1.

Figure 5A:
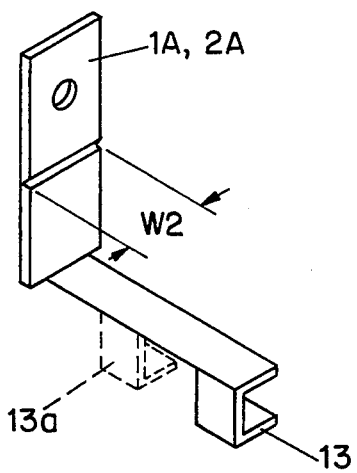
FIG. 5(a) is a perspective view showing the construction of the externally drawn terminal connected to the anode electrode in FIG. 1.
Figure 5B:
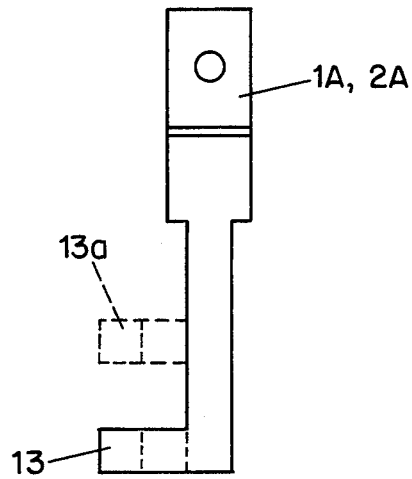
FIG. 5(b) is an elevation view showing the terminal of FIG. 5(a) before bending.

In contrast, the terminals 1A and 2A connected to the anode electrode of respective diodes, are structured as shown in FIGS. 5(a) and 5(b), having a rising part and extended of width W2 extending upwardly from a horizontally disposed terminal leg of the same width which, in turn, has an integral ]-shaped chip-connecting part 13 formed at its tip. The bent chip-connecting part 13, the underside of which is soldered to the anode electrode, plays an important role in absorbing and easing stress caused by heat cycles resulting from the difference in thermal expansion between the molding resin and the metal forming the terminals, as well as preventing the stress from acting directly on the diode chips via the externally drawn terminals. The connecting part 13 is molded and formed so as to protrude form the conductor side of the externally drawn terminals 1A and 2A, as can be seen in the expanded view in FIG. 5(b).

A semiconductor device may be structured so that, with respect to the two sets of diode chips D1 and D2, each diode chip set is divided into two or more chip pieces to be mounted on the chip base 5 in parallel, and the anode electrodes for each chip piece are drawn out and connected in parallel with the externally drawn terminals 1A and 2A. Particularly with diode modules with large current capacity set in a variety of ways, wherein one chip (with its generally square shape) is employed by each set to be disposed side by side in the case, the width occupied by the chips should be increased, which leads to an increased case size. However, if each set of chips is divided into various chips and are laid in one longitudinal row, the width occupied by the chips can be reduced even when the current capacity is the same, so that the product size can be reduced. The chip arrangement can be varied simply by modifying the terminal shown in FIG. 5 by disposing another chip-connecting part 13a branched from the externally drawn terminals 1A and 2A, a shown by the dashed lines.

Figure 6A:
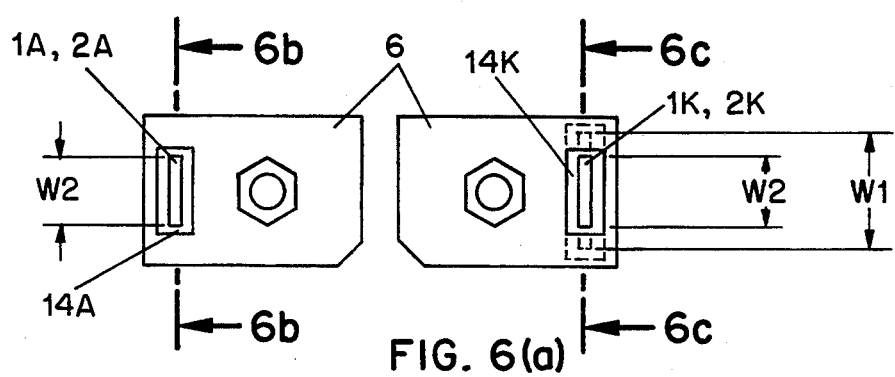
FIG. 6(a) is a plan view showing how terminals are drawing through the enclosing case.
Figure 6B:
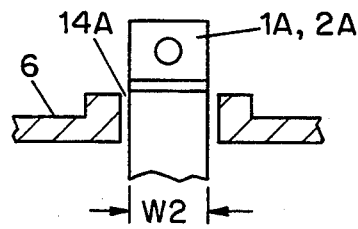
Figure 6C:
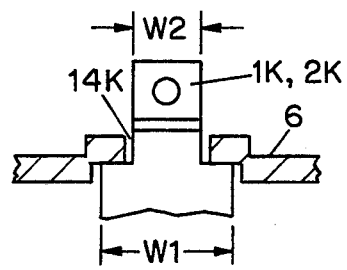

Referring to FIG. 6, and recalling that the rising portion of externally drawn terminals 1K and 2K connected to the cathode electrodes have a conductor width W1 and the rising portion of externally drawn terminals 1A and 2A have a conductor width W2 smaller than W1, the top of the case 6 has a pair of rectangular openings 14A and 14K formed therein through which terminals 1A or 2A and 1K or 2K extend. The opening 14A on the left side, as viewed in FIG. 6(a), through which terminals 1A or 2A on the anode electrodes of the diodes is drawn has a width corresponding to the conductor width W2 of the anode terminal as shown in FIG. 6(b). The rectangular opening 14K on the right side through which the terminals 1K or 2K connected to the cathode electrodes is drawn also has a width W2, but as shown in FIG. 6(c), is surrounded interiorly of the case 6 by a groove having a width W1 which matches the width of the rising portion of terminals 1K and 2K.

Consequently, if when the case 6 is assembled over the terminals the case is fixed correctly, the openings 14A and 14K will accept the externally drawn terminals 1A, 2A and 1K, 2K and allow the case to be mounted. However, if mounting is attempted when the case is fixed incorrectly in reverse, the case cannot be set into place because of the difference in the sizes of the openings. This makes it possible to avoid defects in a product due to an assembly mistake in the case-attaching process, and the polarity-indicating marks 11 arranged on the top of the case, shown in FIG. 1, will correctly match the polarities of the externally drawn terminals 1A, 2A and 1K, 2K.

With the case 6 correctly placed over the terminals, assembly of the device is completed by bending the portion of the terminals which projects from the case by 90° in the directions indicated by the arrows in FIG. 3 so as to secure the case to the internal components and provide the assembly shown in plan in FIG. 1.

Although the illustrated embodiments have been explained for a two-set diode module, it will be apparent that an equivalent effect can be obtained even if the number of chips to be assembled in a diode module is more than three. It will also be understood that the disclosed embodiments can be applied to modules other than the diode module, such as a thyristor module or a power transistor module, for example.

I claim:

1. A semiconductor device comprising:
a case having a top face;
at least first and second semiconductor chips contained within said case, each chip having first and second main electrodes;
first and second externally drawn terminals which are connected to respective main electrodes of each semiconductor chip, said externally drawn terminals being arranged side by side and drawn out through the top face of each case, said externally drawn terminals having the same polarity being arranged in straight rows and said rows of the terminals being arranged in parallel with terminals of different polarities; wherein:
each of said first and second externally drawn terminals includes a riser portion having predetermined width below said top face of said case and an extended portion having predetermined width above said top face of said case,
the width of said riders portion of the first externally drawn terminal is equal to the width of said extended portion of said first externally drawn terminal,
the width of said riser portion of the second externally drawn terminal is greater than the width of said extended portion of said externally drawn terminal,
the width of said rider position of the first externally drawn terminal is equal to the width of said extended portion of said first externally drawn terminal,
said first and second externally drawn terminals extend through respective first and second openings formed in the top face of said case,
said first opening width corresponds to the width of said first extended portion, and
said second opening width corresponds either to said second riser portion or else to said second extended portion with said case having a groove that corresponds to the width of said second riser.

2. A semiconductor device according to claim 1, wherein the riser portion of said first externally drawn terminal is integrally linked to a chip base for mounting a semiconductor chip,
wherein said case is filled with molding resin, and
wherein the riser portion of said first externally drawn terminal has at least one notch formed in an edge thereof for providing a flow path for molding resin injected into said case.

3. A semiconductor device according to claim 2, wherein the riser portion of said first externally drawn terminal is integrally joined to a terminal leg disposed in spaced parallel relationship with the chip base of said first externally drawn terminal, and a chip-connecting part is formed at the tip of said terminal leg, and
wherein said chip-connecting part and said chip-base are bonded by soldering to first and second main electrodes, respectively, of a semiconductor chip.

4. A semiconductor device according to claim 2, wherein chip-connecting part is branched laterally from the side of the terminal leg that faces said semiconductor chip.

5. A semiconductor device according to claim 1, wherein said case is filled with molding resin, and wherein the top face of said case has three resin-injection holes which differ from one another in shape and size so that they can be visually identified.

* * * * *

UNITED STATES PATENT AND TRADEMARK OFFICE
CERTIFICATE OF CORRECTION

PATENT NO. : 5,350,946
DATED : September 27, 1994
INVENTOR(S) : Yukio Murakami

It is certified that error appears in the above-indentified patent and that said Letters Patent is hereby corrected as shown below:

<u>Column 3, line 16</u>, "drawing" should read --drawn--;

<u>Column 3, line 26</u>, "in a" should read --in--;

<u>Column 3, lines 27-29</u>, delete "Connecting conductor pieces used to interconnect two sets of diodes in parallel in the configuration shown in Fig. 7."

<u>Column 4, line 43</u>, "extended" should read --extended portion--;

<u>Column 6, line 15</u>, "riders" should read --riser--;

<u>Column 6, line 23</u>, "rider position of the" should read --extended portion of said--;

<u>Column 6, line 25</u>, "first" should read --second--;

<u>Column 6, line 46</u>, "first" should read --second--;

<u>Column 6, line 54</u>, "claim 2" should read --claim 3--;

<u>Column 6, line 55</u>, "wherein" should read --wherein said--.

Signed and Sealed this

Fourteenth Day of February, 1995

*Attest:*

BRUCE LEHMAN

*Attesting Officer*     *Commissioner of Patents and Trademarks*